(12) United States Patent
Joshi et al.

(10) Patent No.: US 9,036,430 B2
(45) Date of Patent: May 19, 2015

(54) FINFET-BASED BOOSTING SUPPLY VOLTAGE CIRCUIT AND METHOD

(71) Applicant: International Business Machines Corporation, Armonk, NY (US)

(72) Inventors: Rajiv V. Joshi, Yorktown Heights, NY (US); Keunwoo Kim, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 109 days.

(21) Appl. No.: 13/951,585

(22) Filed: Jul. 26, 2013

(65) Prior Publication Data

US 2015/0003174 A1    Jan. 1, 2015

Related U.S. Application Data

(63) Continuation of application No. 13/932,153, filed on Jul. 1, 2013.

(51) Int. Cl.
*G11C 7/00* (2006.01)
*G11C 11/419* (2006.01)
*G11C 5/14* (2006.01)

(52) U.S. Cl.
CPC ............. *G11C 11/419* (2013.01); *G11C 5/14* (2013.01)

(58) Field of Classification Search
USPC ................. 365/129–162, 189.011–225.7
See application file for complete search history.

(56) References Cited

U.S. PATENT DOCUMENTS 7,248,535 B2 * 7/2007 Chun ..................... 365/230.03
7,737,766 B2   6/2010 Dreibelbis et al.
8,008,975 B1   8/2011 Allen et al.
8,120,386 B2 * 2/2012 Luk et al. ..................... 327/61
8,712,349 B2 * 4/2014 Southcombe et al. ..... 455/127.1

(Continued)

FOREIGN PATENT DOCUMENTS

JP    59-011680    1/1984
JP    62-136919    6/1987

OTHER PUBLICATIONS

Young Bok Kim, et al., "Low Power 8T SRAM Using 32nm Independent Gate FinFET Technology," 2008 IEEE International Workshop on Design and Test of Nano Devices, Circuits and Systems, Dept. of Elect. & Comput. Eng., Northeastern Univ., pp. 247-250, 2008.

(Continued)

*Primary Examiner* — Harry W Byrne
(74) *Attorney, Agent, or Firm* — Preston J. Young, Esq.; Otterstedt, Ellenbogen & Kammer, LLP

(57) ABSTRACT

A memory circuit includes a voltage boosting circuit for generating a voltage that exceeds a voltage supply of the voltage boosting circuit. The voltage boosting circuit includes a first transistor having a first polarity type and a second transistor having a second polarity type opposite the first transistor. The first transistor is a planar transistor, a source of the first transistor being connected with the voltage supply, and a gate of the first transistor receiving a control signal. The second transistor includes a gate formed in at least two planes. A source of the second transistor is connected with the voltage supply, a gate of the second transistor receives the control signal, and a drain of the second transistor is connected with a drain of the first transistor and forms an output of the voltage boosting circuit for generating a boosted supply voltage as a function of the control signal.

9 Claims, 11 Drawing Sheets

(56) References Cited

U.S. PATENT DOCUMENTS

| | | | |
|---|---|---|---|
| 2005/0212022 A1* | 9/2005 | Greer et al. | 257/296 |
| 2006/0160311 A1* | 7/2006 | Rao et al. | 438/275 |
| 2006/0164180 A1* | 7/2006 | Nowak | 333/103 |
| 2011/0241767 A1 | 10/2011 | Curatola et al. | |
| 2013/0049788 A1* | 2/2013 | McAndrew et al. | 324/762.01 |
| 2013/0049852 A1* | 2/2013 | McAndrew et al. | 327/566 |
| 2013/0141962 A1* | 6/2013 | Liaw | 365/154 |

OTHER PUBLICATIONS

Ajay N. Bhoj and Niraj K. Jha, "Pragmatic Design of Gated-diode FinFET DRAMs," 2009 IEEE International Conference on Computer Design, Dept. of Elect. Eng., Princeton University, Princeton, NJ, pp. 390-397, 2009.

Kiyoo Itoh, et al., "0.5-V High-Speed Circuit Designs for Nanoscale SoCs—Challenges and Solutions," 2011 International Symposium on Integrated Circuits, pp. 617-622, 2011.

* cited by examiner

| | FREQ (GHZ) → | | | VDD=1.06V | | |
|---|---|---|---|---|---|---|
| VCS | 3.7 | 3.8 | 3.9 | 4.0 | 4.1 | 4.2 |
| 0.95 | P | P | F | F | F | F |
| 1.00 | P | P | F | F | F | F |
| 1.05 | P | P | P | F | F | F |
| 1.10 | P | P | P | F | F | F |
| 1.15 | P | P | P | F | F | F |
| 1.2 | P | P | P | P | F | F |
| 1.25 | P | P | P | P | F | F |
| 1.30 | P | P | P | P | F | F |
| 1.35 | P | P | P | P | F | F |

| | FREQ (MHZ) → | | | | VDD=1.00V | | | |
|---|---|---|---|---|---|---|---|---|
| VCS | 3780 | 3808 | 3836 | 3864 | 3892 | 3920 | 3948 | 3976 |
| 0.90 | P | P | F | F | F | F | F | F |
| 0.95 | P | P | P | P | F | F | F | F |
| 1.00 | P | P | P | P | P | P | F | F |
| 1.05 | P | P | P | P | P | P | F | F |
| 1.10 | P | P | P | P | P | P | P | F |
| 1.15 | P | P | P | P | P | P | P | F |

FINFET-BASED BOOSTING SUPPLY VOLTAGE CIRCUIT AND METHOD

CROSS-REFERENCE TO RELATED APPLICATIONS

The present application is a continuation of U.S. patent application Ser. No. 13/932,153, filed on Jul. 1, 2013, the contents of which are expressly incorporated herein by reference in its entirety for all purposes.

BACKGROUND

The present invention relates generally to electrical, electronic and computer arts, and more particularly relates to memory storage components and systems.

In a memory system employing six-transistor (6T) or eight-transistor (8T) static random access memory (SRAM) cells, in order to improve the stability of conventional 6T or 8T memory cells, a variety of techniques have been proposed. Such techniques include, for example, providing dual-voltage supplies, using multiple-threshold voltage (multi-$V_T$) transistor devices, decreasing the length of bit lines used in the memory cells, employing power supply boosting via interconnects, adding transistors to the cells, and using a charge pump to boost the voltage supply to the memory cells, among other techniques.

Unfortunately, however, each of the above-noted techniques for improving the stability of 6T or 8T SRAM cells results in one or more disadvantages, such as, for example, increased integrated circuit (IC) area, increased power consumption, increased circuit complexity or overhead, and supply voltage penalty. Specifically, multiple fixed voltage supplies are conventionally applied to memory cells, word line drivers, and peripheral logic in an attempt to combat stability and writeability issues. However, the use of multiple voltage supplies and their conversion from on-chip is complex, and conversion efficiency is often an issue. Accordingly, conventional solutions for improving the stability of 6T and 8T SRAM cells are generally not well-suited for low-power applications. Furthermore, it is difficult to achieve a simplified solution which meets stability, performance and minimum supply voltage (Vmin) requirements of modern applications and systems.

BRIEF SUMMARY

Principles of the invention provide a boosted voltage supply circuit architecture suitable for use, for example, in a memory system or logic circuit, having improved performance and/or reduced circuit complexity and overhead. More particularly, embodiments of the invention provide a dynamic voltage supply boosting technique which beneficially increases the operating voltage range of the circuitry in which the voltage supply boosting technique is used by enabling the circuitry to operate at a lower minimum supply voltage (Vmin). Techniques according to the invention advantageously eliminate the need for multiple voltage supplies in the system while reducing power consumption. In this manner, embodiments of the invention are well-suited for use in low-power applications.

In accordance with an embodiment of the invention, a voltage boosting circuit suitable for use in a memory circuit is provided for generating an output voltage having a magnitude that is greater than a voltage generated by a voltage supply of the voltage boosting circuit. The voltage boosting circuit includes at least first and second transistors. The first transistor is a planar transistor, a source of the first transistor being adapted for connection with a voltage supply of the voltage boosting circuit, and a gate of the first transistor being adapted to receive a control signal supplied to the voltage boosting circuit. The second transistor has a gate formed in at least two planes, a source of the second transistor being adapted for connection with the voltage supply, a gate of the second transistor being adapted to receive the control signal, and a drain of the second transistor being connected with a drain of the first transistor and forming an output of the voltage boosting circuit for generating a boosted supply voltage as a function of the control signal.

In accordance with another embodiment of the invention, a memory circuit includes at least one word line, a plurality of bit lines, and a plurality of memory cells coupled with the word and bit lines. A given one of the memory cells is individually accessed by selectively activating a unique pair of a corresponding one of the bit lines and word line coupled with the given memory cell. The memory circuit further includes a voltage boosting circuit connected with at least a subset of the memory cells for generating an output voltage having a magnitude that is greater than a voltage generated by a voltage supply of the memory circuit. The voltage boosting circuit includes at least first and second transistors. The first transistor is a planar transistor, a source of the first transistor being adapted for connection with a voltage supply of the memory circuit, and a gate of the first transistor being adapted to receive a first control signal supplied to the voltage boosting circuit. The second transistor has a gate formed in at least two planes, a source of the second transistor being adapted for connection with the voltage supply, a gate of the second transistor being adapted to receive the first control signal, and a drain of the second transistor being connected with a drain of the first transistor and forming an output of the voltage boosting circuit for generating a boosted supply voltage as a function of the first control signal.

These and other features, objects and advantages of the present invention will become apparent from the following detailed description of illustrative embodiments thereof, which is to be read in conjunction with the accompanying drawings.

BRIEF DESCRIPTION OF THE SEVERAL VIEWS OF THE DRAWINGS

The following drawings are presented by way of example only and without limitation, wherein like reference numerals (when used) indicate corresponding elements throughout the several views, and wherein:

FIGS. 3A and 3B are tables depicting exemplary test results associated with an illustrative memory circuit employing dual voltage supplies;

Figure 1:
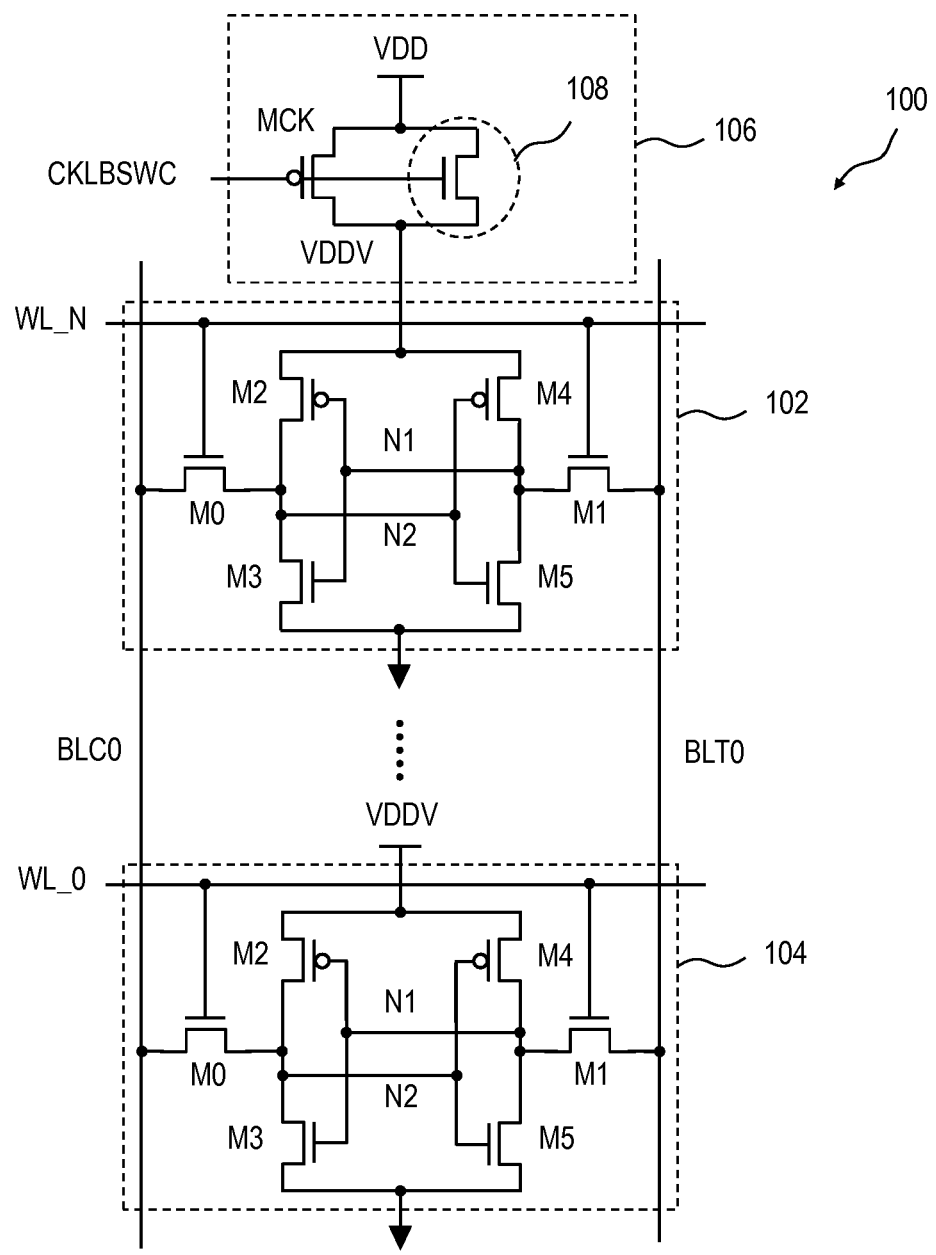
FIG. 1 is a schematic diagram depicting at least a portion of an exemplary memory circuit in which techniques of the invention may be employed.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative embodiments of a memory architecture (e.g., employing 6T or 8T SRAM cells) and logic circuitry employing dynamic voltage supply boosting. It is to be appreciated, however, that the invention is not limited to the specific circuits and/or methods illustratively shown and described herein. Rather, aspects of the invention are directed more broadly to techniques for reducing a minimum supply voltage (Vmin) of a circuit, thereby increasing an operational supply voltage range of the circuit. Voltage supply boosting circuitry formed in accordance with embodiments of the invention provide improved performance, particularly a reduced minimum operational supply voltage, without a need for multiple voltage supplies, and are thus well-suited for use in low power applications. Moreover, it will become apparent to those skilled in the art given the teachings herein that numerous modifications can be made to the embodiments shown that are within the scope of the claimed invention. Thus, no limitations with respect to the embodiments shown and described herein are intended or should be inferred.

For the purpose of describing and claiming embodiments of the invention, the term MISFET as used herein is intended to be construed broadly and to encompass any type of metal-insulator-semiconductor field-effect transistor. The term MISFET is, for example, intended to encompass semiconductor field-effect transistors that utilize an oxide material as their gate dielectric (i.e., metal-oxide-semiconductor field-effect transistors (MOSFETs)), as well as those that do not. In addition, despite a reference to the term "metal" in the acronym MISFET, the term MISFET is also intended to encompass semiconductor field-effect transistors (FETs) wherein the gate is formed from a non-metal, such as, for instance, polysilicon.

Although implementations of the present invention described herein may make reference to implementations using p-channel MISFETs (hereinafter called "PFET" or "PMOS" devices) and n-channel MISFETs (hereinafter called "NFET" or "NMOS" devices), as may be formed using a complementary metal-oxide-semiconductor (CMOS) fabrication process, it is to be appreciated that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be understood by those skilled in the art. Moreover, although preferred embodiments of the invention are typically fabricated in a silicon wafer, embodiments of the invention can alternatively be fabricated in wafers comprising other materials, including but not limited to gallium arsenide (GaAs), indium phosphide (InP), etc.

Advantages of the dynamic supply voltage boosting techniques according to embodiments of the invention will first be described herein in the context of an illustrative memory architecture. FIG. 1 is a schematic diagram depicting at least a portion of an exemplary memory circuit 100 in which techniques of the invention may be employed. The memory circuit 100 includes a plurality of memory cells, 102 and 104, only two of which are shown for brevity of description. The memory circuit 100 further includes a plurality of corresponding bit lines, BLC0 and BLT0, and word lines, WL_0 through WL_N, coupled with the memory cells 102, 104 for selectively accessing the cells. In this embodiment, complementary bit line pairs (true and complement) are associated with each column in the memory circuit, although it is to be understood that alternative memory architectures can be employed. The memory circuit 100 is organized such that a given memory cell is individually accessed by activating a unique pair of a corresponding bit line (or complementary bit line pair, in this embodiment) and word line coupled with the given memory cell. For example, memory cell 104 is accessed by activating corresponding complementary bit lines BCL0, BCT0, and corresponding word line WL_0.

Each of the memory cells 102, 104 in the memory circuit 100 comprises a 6T SRAM cell formed in a conventional manner, although the memory cells are not limited to this configuration. Specifically, each of the memory cells 102, 104 includes first and second NFETs, M0 and M1, operative as access devices. A source of NFET M0 is adapted for connection with corresponding bit line BLC0, a source of NFET M1 is adapted for connection with corresponding bit line BLT0, gates of M0 and M1 are adapted for connection with corresponding word line WL_N, and drains of M0 and M1 are connected with a storage element comprising a pair of cross-coupled inverters. A first inverter includes a PFET M2 and an NFET M3, a source of M2 connected with a first voltage supply, which in this embodiment is a virtual voltage supply VDDV, drains of M2 and M3 are connected with a drain of access device M0 and form an output of the first inverter, a source of M3 is connected with ground, or an alternative voltage return, and gates of M2 and M3 are connected together at node N1 and form an input of the first inverter. Similarly, a second inverter includes a PFET M4 and an NFET M5, a source of M4 connected with the virtual supply VDDV, drains of M4 and M5 are connected with a drain of access device M1 and form an output of the second inverter, a source of M5 is connected with ground, and gates of M4 and M5 are connected together at node N2 and form an input of the second inverter. The output of the first inverter is connected with the input of the second inverter at node N2, and the output of the second inverter is connected with the input of the first inverter at node N1.

It is to be appreciated that, because a MOSFET device is symmetrical in nature, and thus bi-directional, the assignment of source and drain designations in the MOSFET device is essentially arbitrary. Therefore, the source and drain of a given MOSFET device may be referred to herein generally as first and second source/drain, respectively, where "source/drain" in this context denotes a source or a drain.

The memory circuit 100 further includes a voltage boosting circuit 106. The voltage boosting circuit 106 is connected with the memory cells 102, 104 and is operative to generate the virtual voltage supply VDDV from a second voltage supply, which in this embodiment is VDD. The voltage boosting circuit 106 includes a PFET, MCK, having a source adapted for connection with VDD, a gate adapted to receive a control signal, CKLBSWC, supplied to the memory circuit 100, and a source connected with the memory cells 102, 104 and operative to generate the virtual supply voltage VDDV. The voltage boosting circuit 106 further includes an NFET boost transistor 108 connected in parallel with PFET MCK. Specifically, a drain of boost transistor 108 is adapted for connection to VDD, a gate of transistor 108 is connected with the gate of PFET MCK, and a source of transistor 108 is connected with the drain of MCK.

Figure 2A:
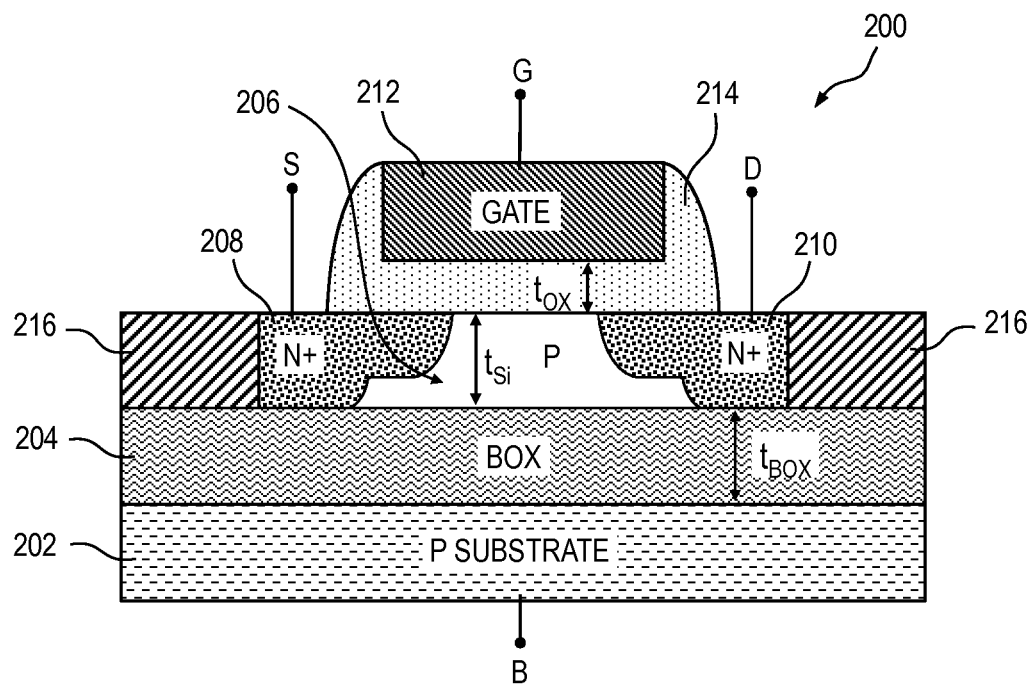
FIG. 2A is a cross-sectional view depicting at least a portion of an exemplary partially-depleted (PD) silicon-on-insulator (SOI) n-channel field-effect transistor (NFET) device suitable for implementing the boost transistor shown in FIG. 1.

Transistor 108 in the voltage boosting circuit 106 is implemented, in this embodiment, using a floating-body partially-depleted (PD) silicon-on-insulator (SOI) device, with its gate controlled by the signal CKLBSWC. FIG. 2A is a cross-sectional view depicting at least a portion of an exemplary PD SOI NFET device 200 suitable for implementing the boost transistor 108 shown in FIG. 1. The illustrative device 200 includes a substrate 202, a P-type substrate in this embodiment, and a buried oxide (BOX) layer 204 formed thereon. An active layer 206 having a P-type conductivity, in this embodiment, is formed on at least a portion of the buried oxide layer 204. Devices formed in the active layer 206 are electrically isolated from the substrate 202, or bulk (i.e., body) wafer material, by the buried oxide layer 204. Source and drain regions 208 and 210, respectively, having an N-type conductivity are formed in the active layer 206 and spaced laterally from one another. A gate 212 is formed on a thick oxide layer (TOX) 214 deposited over at least a portion of an upper surface of the semiconductor structure. The gate 212 is positioned above the active layer 206, between the source and drain regions 208, 210, and is electrically isolated from the active layer by the thick oxide layer 214. Field oxide regions 216 formed through the active layer 206 electrically isolate adjacent devices formed in the active layer from one another.

Figure 2B:
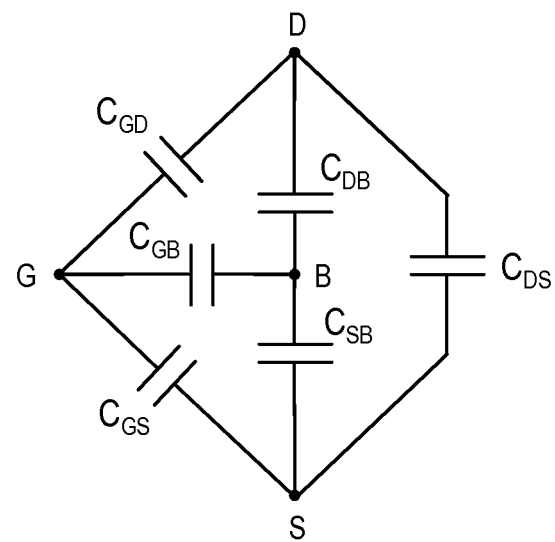
FIG. 2B is a schematic diagram depicting a model of parasitic capacitances associated with the exemplary PD SOI NFET device shown in FIG. 2A.

FIG. 2B is a schematic diagram depicting a model of parasitic capacitances associated with the exemplary PD SOI NFET device 200 shown in FIG. 2A, where CGD represents gate-to-drain capacitance, CGS represents gate-to-source capacitance, CDS represents drain-to-source capacitance, CGB represents gate-to-body capacitance, CDB represents drain-to-body capacitance, and CSB represents source-to-body capacitance. As apparent from this model, the body or bulk (B) connection is floating. Floating-body regions are unique to partially depleted SOI transistors due to the presence of the buried oxide layer 204 separating the transistor devices from the substrate 202, as previously stated. An inherent advantage of this floating-body structure is that this region can store charge, which in turn creates a modified switching threshold point. This modified threshold moves up and down slightly due to changes in the stored charge, which improves switching performance.

With continued reference to FIG. 1, during a standby mode of operation, the control signal CKLBSWC is low (e.g., zero volts), and thus PFET MCK in the voltage boosting circuit 106 will be turned on and the boost transistor 108 will be turned off. With MCK turned on, the virtual supply voltage VDDV will be at VDD, ignoring any negligible voltage drop across MCK. With the boost transistor 108 turned off and both its drain and source at VDD, the floating body of transistor 108 will also be at VDD.

During a read or write operation, the CKLBSWC signal ramps to a high level (e.g., VDD), thus turning off MCK. The ramping up of the CKLBSWC signal applied to the gate of the boost transistor 108 is capacitively coupled with the floating body of transistor 108, thereby bringing the floating body of transistor 108 to a level significantly above VDD. As such, the source node of transistor 108, which is connected with the virtual supply VDDV for the memory cells 102, 104, is capacitively coupled up to a voltage level above VDD by the source-to-body capacitance CSB.

Using a planar NFET device as the boost transistor 108 has disadvantages, including, but not limited to, a large area penalty. Furthermore, the boost voltage achievable using a planar device is limited due to its capacitance. As an alternative approach to temporarily boosting the voltage supply during a read or write operation, a memory architecture may employ multiple fixed voltage supplies. For example, in a dual-supply memory architecture, a first fixed voltage supply (e.g., VDD) is used for powering logic circuitry (e.g., word line driver, address decoder, clock circuit, etc.) in the memory, and a second fixed voltage supply (e.g., VCS) is used for powering memory cells (e.g., SRAM cells 102 and 104 shown in FIG. 1). A word line driver can be on the same voltage supply as that of the SRAM cells (e.g., node WL_N in FIG. 1).

FIGS. 3A and 3B are tables 302 and 304, respectively, depicting exemplary test results (e.g., pass (P) or fail (F)) associated with an illustrative memory circuit employing dual voltage supplies. With reference to FIG. 3A, table 302 includes exemplary results for a memory test in which a first voltage supply (VDD) used to power logic circuitry in the memory device under test is fixed at 1.06 volts, and a second voltage supply (VCS) used to power the memory cells is varied in a range between 0.95 volt and 1.35 volts for selected frequencies of operation between 3.7 gigahertz (GHz) and 4.2 GHz. Likewise, with reference to FIG. 3B, table 304 includes exemplary results for a memory test in which the first voltage supply (VDD) used to power the logic circuitry is fixed at 1.00 volts, and the second voltage supply (VCS) used to power the memory cells is varied in a range between 0.90 volt and 1.15 volts for selected frequencies of operation between 3.780 GHz and 3.976 GHz. As apparent from tables 302 and 304, the pass rate for the memory circuit increases as the voltage supplied to the memory cells is increased.

Unfortunately, using multiple fixed voltage supplies in a circuit requires maintaining separate voltage supply connections for each voltage supply employed, which substantially increases routing congestion and overall area of the integrated circuit device, among other disadvantages. Furthermore, using multiple fixed voltage supplies consumes substantially more power, as it is not dynamic with respect to the word line. Consequently, achieving a reduced minimum operating voltage Vmin with a single voltage supply is difficult. In accordance with an embodiment of the invention, a voltage boost circuit is constructed using at least one fin-shaped field-effect transistor (FinFET), or an alternative transistor device having a gate formed in at least two planes (e.g., silicon nanowire transistor, T-shaped field-effect transistor (T-FET), devices having a gate which completely surrounds the channel region, etc.), operative as a voltage-boosting element.

Figure 4:
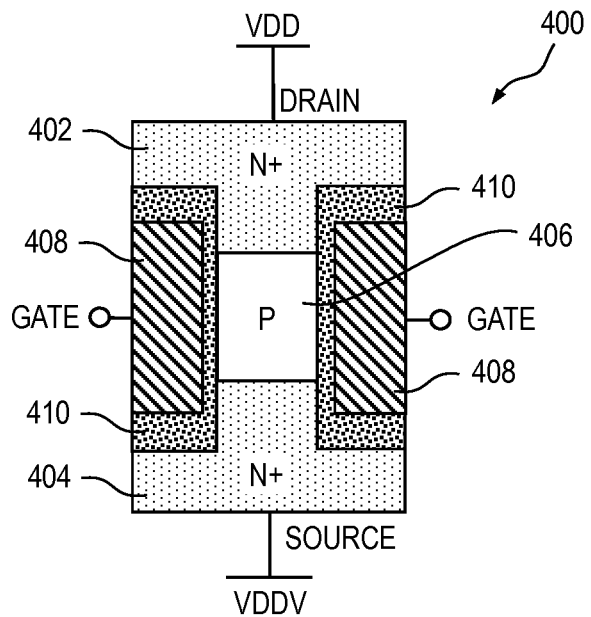
FIG. 4 is a top plan view depicting at least a portion of an exemplary n-channel FinFET device which can be employed for dynamically boosting supply voltage, according to an embodiment of the invention.

FIG. 4 is a top plan view depicting at least a portion of an exemplary n-channel FinFET device 400 which can be employed for dynamically boosting supply voltage, according to an embodiment of the invention. The FinFET device 400 includes a drain region 402 and a source region 404 formed in a body region 406 of the device, the drain and source regions being laterally separated from one another. The body region 406, in this embodiment, is formed having a p-type conductivity, and the drain and source regions 402, 404 are each formed having an n-type conductivity. One or more gate structures 408 are formed in the device 400, with a gate oxide layer 410 providing electrical isolation between the gate 408 and the respective drain and source regions 402, 404. A distinguishing characteristic of the FinFET device 400 is that a conducting channel in the device is wrapped by a thin silicon "fin," which forms the body 406 of the device. A thickness of the fin, measured in a direction from the source region 404 to the drain region 402, determines an effective channel length of the device 400. Similarly, a PFET can be used, particularly when the drain and source voltages, Vd and Vs, respectively, of the gate of the PFET are at zero.

One advantage of a FinFET device (e.g., FinFET 400 shown in FIG. 4), particularly in a boosted supply voltage application, is that due to its three-dimensional gate structure (i.e., the gate being formed in at least two distinct planes), there is a substantially higher capacitive coupling effect, due to an increased parasitic capacitance in the device, particularly between the gate 408 and source region 404, as well as between the gate and drain region 402. The added parasitic capacitance of the FinFET device can be beneficially exploited, for example, in the context of the exemplary voltage boosting circuit 106 shown in FIG. 1, by replacing the planar PD SOI NFET device as the boost transistor 108, to thereby provide enhanced performance. Moreover, this enhanced performance can be achieved without increasing the overall area or power consumption of the circuit. In the memory circuit application shown in FIG. 1, the drain region 402 of the FinFET device 400 is connected with VDD, the source region 404 forms the virtual voltage supply node VDDV, and the gate 408 is configured to receive the signal CKLBSWC.

Although an n-channel FinFET is shown and described herein, it is to be appreciated that a p-channel FinFET device may also be employed, according to one or more embodiments of the invention. When using a p-channel FinFET, the control signal supplied to the gate of the device would be inverted (e.g., by passing the signal CKLBSWC through an inverter, not explicitly shown), as will become apparent to those skilled in the art.

Figure 5:
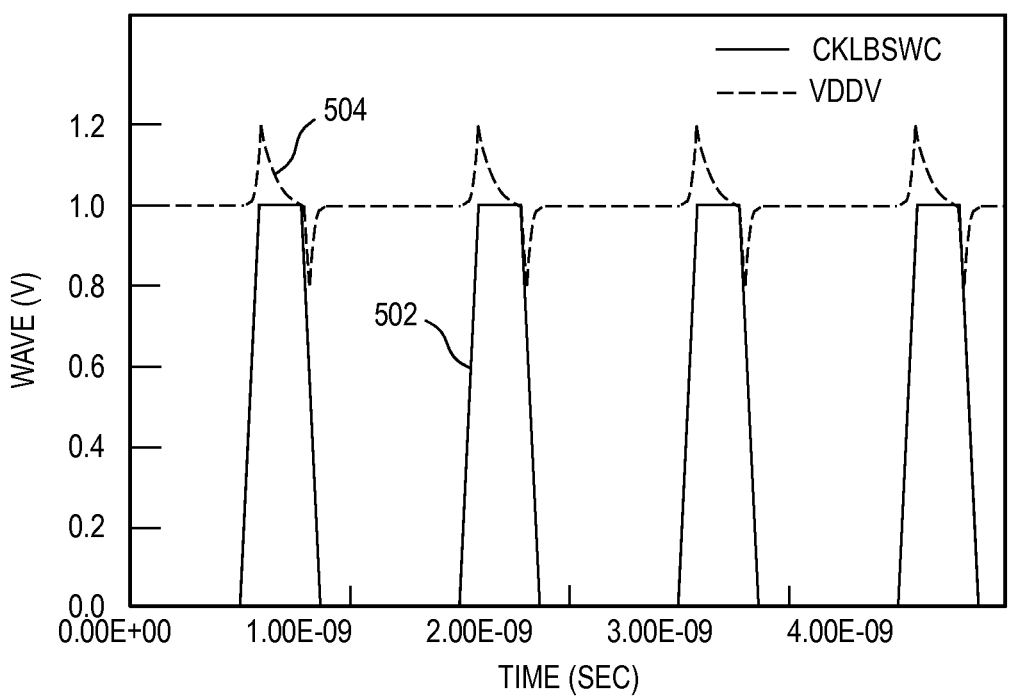
FIG. 5 graphically depicts exemplary waveforms of certain signals in the illustrative voltage boosting circuit shown in FIG. 1 using a FinFET device as the voltage-boosting element.
Figure 6:
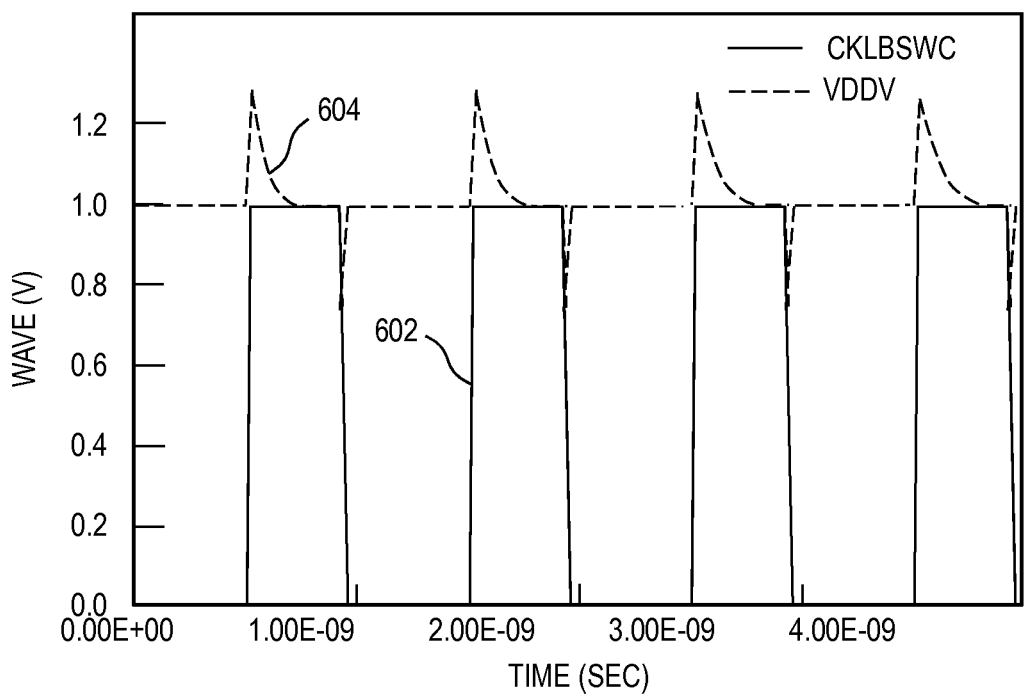
FIGS. 6 through 9 depict exemplary waveforms of a control signal applied to the FinFET voltage-boosting transistor and a boosted voltage supply in the illustrative voltage boosting circuit shown in FIG. 1 under various illustrative circuit conditions, according to embodiments of the invention.

By way of example only, FIG. 5 graphically depicts exemplary waveforms of certain signals in the illustrative voltage boosting circuit 106 shown in FIG. 1 using a FinFET device as the voltage-boosting element (e.g., boost transistor 108). The waveforms shown in FIG. 5 are obtained using a fixed VDD supply voltage of 1.0 volt, a pulse width of the signal CKLBSWC of about 400 picoseconds (ps), and a slew rate of signal CKLBSWC of about 50 ps. In this embodiment, the pulse width of the signal CKLBSWC is indicative of a period of time between changes of state (e.g., low, to high, to low again) of CKLBSWC.

With reference to FIG. 5, a first waveform 502 is indicative of the signal CKLBSWC supplied to the gate of the FinFET boost transistor, and a second waveform 504 is indicative of the virtual supply VDDV which powers the memory cells (e.g., memory cells 102, 104 in FIG. 1). As apparent from FIG. 5, whenever the signal CKLBSWC transitions from low (e.g., 0 volts) to high (e.g., 1.0 volt), the capacitive coupling effect (e.g., between the gate and source) of the FinFET device pulls the virtual supply VDDV above VDD, up to a peak of about 1.2 volts, for a substantial portion of the pulse duration (e.g., about 250 ps). Although the virtual supply VDDV is pulled below VDD (e.g., to about 0.8 volt) for a short time (e.g., about 50 ps) when the signal CKLBSWC transitions from high to low, the effect on the memory circuit will be insignificant since the read or write cycle will have already completed at this point.

Important benefits of a FinFET-based voltage boosting circuit according to embodiments of the invention are that the elevated output voltage provided by the circuit is essentially independent of pulse width and that the magnitude of FinFET voltage boosting is actually more pronounced at lower supply voltages, among other advantages. Thus, the voltage boosting techniques in accordance with embodiments of the invention enable memory or logic circuitry, for example, used in conjunction with the FinFET-based voltage boosting circuit to be operated at a lower minimum supply voltage Vmin, without the need for multiple fixed voltage supplies and without additional integrated circuit area requirements.

By way of example only and without limitation, FIGS. 6 through 9 depict exemplary waveforms of the signal CKLBSWC and the virtual voltage supply VDDV in the voltage boosting circuit 106 shown in FIG. 1 using a FinFET device as the voltage-boosting element under various illustrative circuit parameters, according to embodiments of the invention. Specifically, in FIG. 6, a first waveform 602 is indicative of the signal CKLBSWC and a second waveform 604 is indicative of the virtual supply VDDV which is generated by the voltage boosting circuit. The waveforms 602, 604 are obtained using a fixed VDD supply voltage of 1.0 volt, a pulse width of the signal CKLBSWC of about 400 picoseconds (ps), and a slew rate of signal CKLBSWC of about 25 ps. As apparent from FIG. 6, whenever the signal CKLBSWC transitions from low (e.g., 0 volts) to high (e.g., 1.0 volt), the capacitive coupling effect of the FinFET device pulls the virtual supply VDDV above VDD, to a maximum of about 1.3 volts, for a substantial portion of the pulse duration (e.g., about 250 ps). Comparing FIG. 6 with FIG. 5, it is evident that the sharper slew rate results in a greater boosting voltage; namely, about 1.3 volts for a slew rate of 25 ps versus about 1.2 volts for a slew rate of 50 ps. The duration of the boosting voltage remains essentially the same for both cases.

Figure 7:
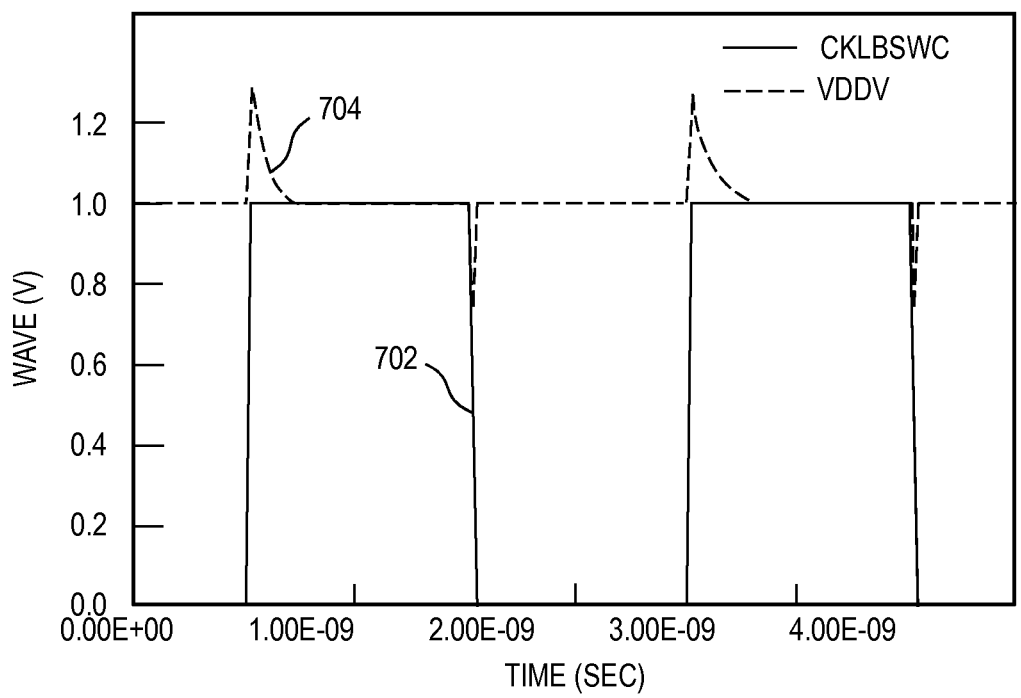

FIG. 7 depicts a first waveform 702 is indicative of the signal CKLBSWC and a second waveform 704 is indicative of the virtual supply VDDV which is generated by the voltage boosting circuit. The waveforms 702, 704 are obtained using a fixed VDD supply voltage of 1.0 volt, a pulse width of the signal CKLBSWC of about 1 nanosecond (ns), and a slew rate of signal CKLBSWC of about 25 ps. As shown in FIG. 7, whenever the signal CKLBSWC transitions from low (e.g., 0 volts) to high (e.g., 1.0 volt), the capacitive coupling effect of the FinFET device pulls the virtual supply VDDV above VDD, to a maximum of about 1.3 volts, for a substantial portion of the pulse duration (e.g., about 250 ps). Comparing FIG. 7 with FIGS. 5 and 6, the sharper slew rate again results in an increased boosting voltage; namely, about 1.3 volts for a slew rate of 25 ps and about 1.2 volts for a slew rate of 50 ps. Furthermore, the duration of the boosting voltage is essentially independent of the pulse width of the CKLBSWC signal.

Figure 8:
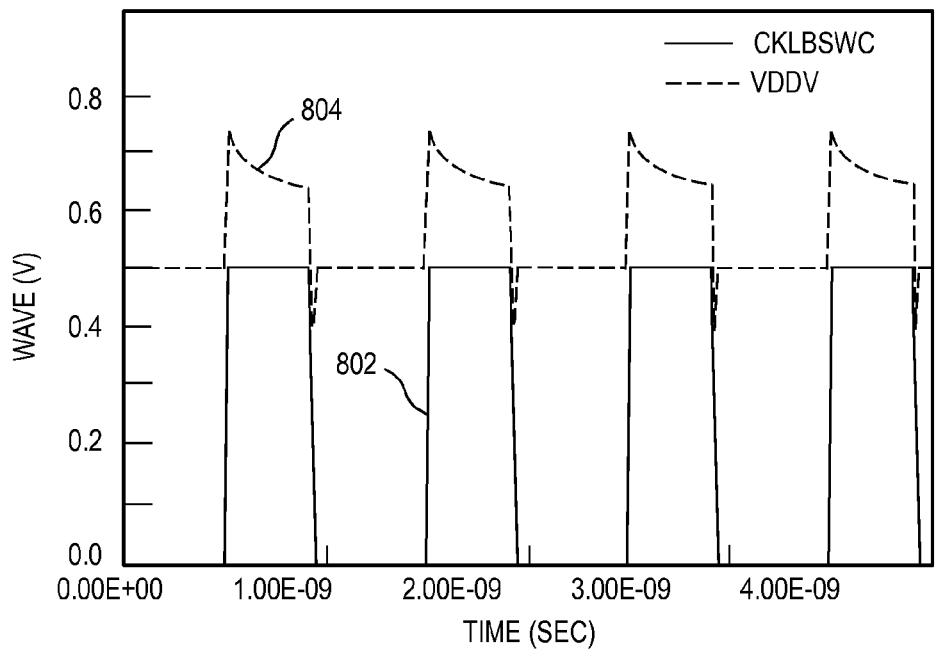

With reference now to FIG. 8, a first waveform 802 is indicative of the signal CKLBSWC and a second waveform 804 is indicative of the virtual supply VDDV which is generated by the voltage boosting circuit. The waveforms 802, 804 are obtained using a fixed VDD supply voltage of 0.5 volt, a pulse width of the signal CKLBSWC of about 400 picoseconds (ps), and a slew rate of signal CKLBSWC of about 25 ps. As apparent from FIG. 8, whenever the signal CKLBSWC transitions from low (e.g., 0 volts) to high (e.g., 0.5 volt), the capacitive coupling effect of the FinFET device pulls the virtual supply VDDV above VDD, to a maximum of about 0.74 volts. However, for this low supply voltage scenario, the amount of time that the virtual supply VDDV remains substantially above VDD is extended to the entire duration of the CKLBSWC pulse. For example, the VDDV supply voltage, even after about 400 ps, remains at about 0.64 volt.

Figure 9:
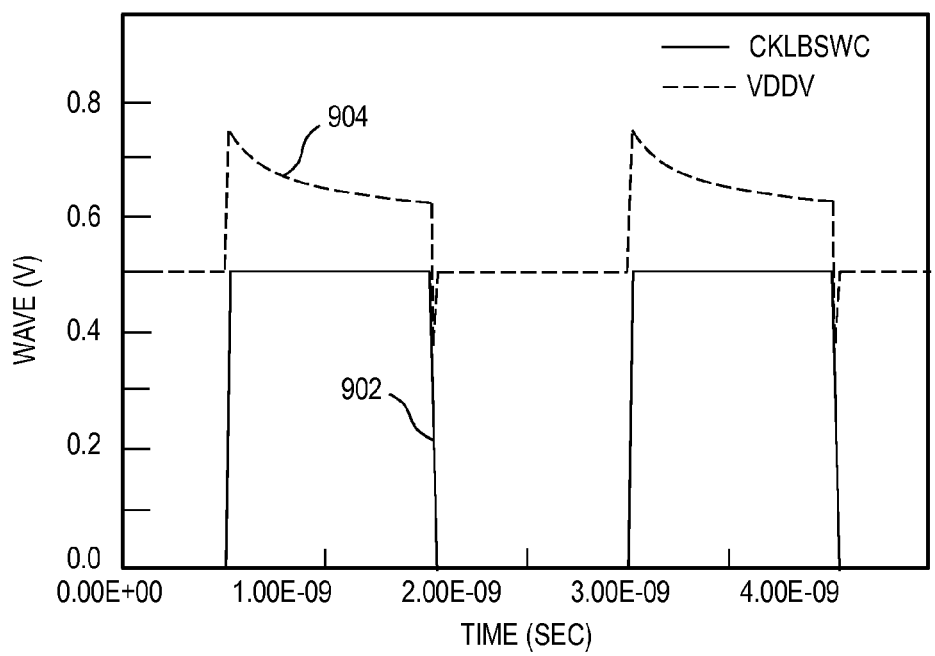

Likewise, in FIG. 9, a first waveform 902 is indicative of the signal CKLBSWC and a second waveform 904 is indicative of the virtual supply VDDV which is generated by the voltage boosting circuit. The waveforms 902, 904 are obtained using a fixed VDD supply voltage of 0.5 volt, a pulse width of the signal CKLBSWC of about 1 ns, and a slew rate of signal CKLBSWC of about 25 ps. With reference to FIG. 9, whenever the signal CKLBSWC transitions from low (e.g., 0 volts) to high (e.g., 0.5 volt), the capacitive coupling effect of the FinFET device pulls the virtual supply VDDV above VDD, to a maximum of about 0.74 volts. In this extended pulse width scenario, the virtual supply VDDV again remains above VDD for the entire duration of the CKLBSWC pulse. For example, the VDDV supply voltage, even after about 1 ns, remains at about 0.61 volt. Thus, it is evident that the FinFET-based voltage boosting circuit according to embodiments of the invention provides superior performance compared to using a planar FET device as the voltage boosting element, particularly at low supply voltages (e.g., about 0.5 volt), thereby enabling the minimum supply voltage Vmin to be reduced.

Figure 10:
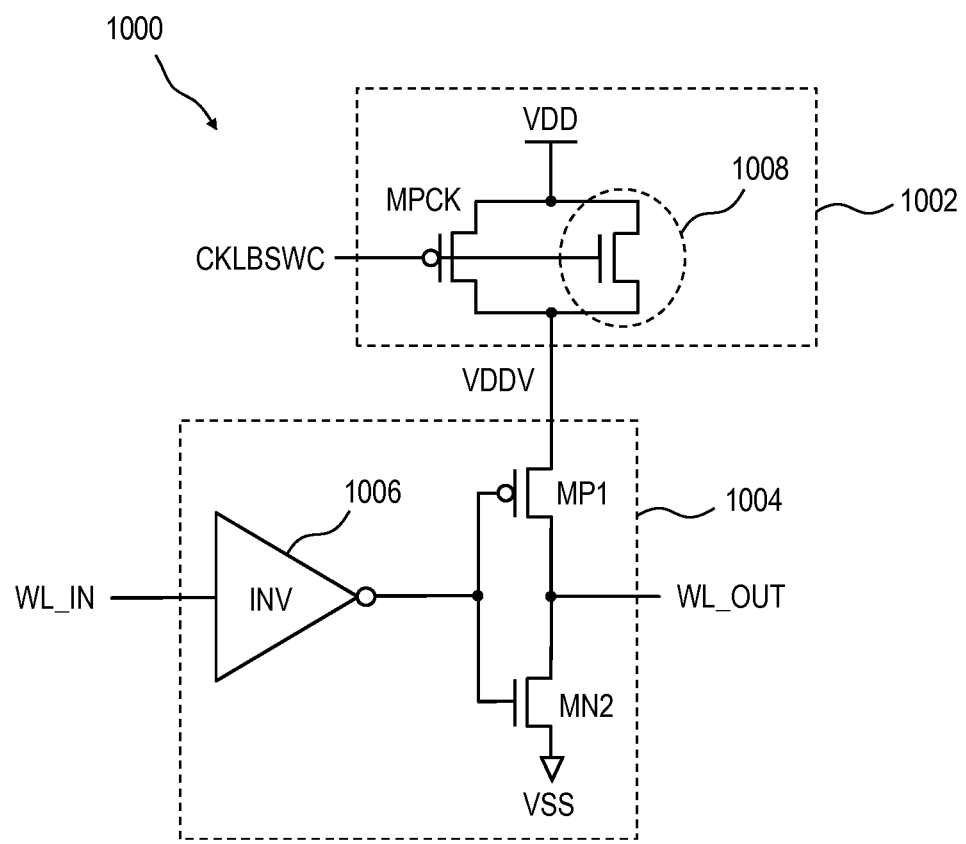
FIG. 10 is a schematic diagram depicting at least a portion of an exemplary word line driver circuit, according to an embodiment of the invention.

The benefits of dynamic voltage boosting according to aspects of the invention can be similarly applied to circuitry other than an SRAM array. For example, embodiments of the invention can be applied to dynamically boosting the voltage supply of latches, sense amplifiers, clock buffers, content addressable memory (CAM), ternary content-addressable memory (TCAM), multi-port register files and other memory arrays, etc., where the performance benefits of a higher voltage supply can be exploited. By way of example only and without limitation, FIG. 10 is a schematic diagram depicting at least a portion of an exemplary word line driver circuit 1000, according to an embodiment of the invention. The word line driver circuit 1000 includes a voltage boosting circuit 1002 formed in accordance with an aspect of the invention. Specifically, the voltage boosting circuit 1002 includes a PFET MPCK connected in parallel with an n-channel FinFET device 1008 operative as a voltage-boosting element. A source of PFET MPCK and a drain of FinFET 1008 are adapted for connection with a voltage supply of the circuit, which in this embodiment is VDD, gates of MPCK and FinFET 1008 are connected together and adapted to receive a control signal CKLBSWC, and a drain of MPCK and a source of FinFET 1008 are connected together and form an output of the voltage boosting circuit 1002 for generating a virtual (boosted) supply voltage VDDV.

As previously stated, although an n-channel FinFET is shown and described herein, it is to be appreciated that a p-channel FinFET device may also be employed, according to one or more embodiments of the invention. When using a p-channel FinFET, the control signal supplied to the gate of the device may require inversion (e.g., by passing the signal CKLBSWC through an inverter, not explicitly shown), as will become apparent to those skilled in the art.

The word line driver circuit 1000 includes an output driver 1004 coupled with the voltage boosting circuit 1002. Specifically, the output driver 1004 comprises a first inverter 1006 which is powered by VDD, and a second inverter including a PFET, MP1, and an NFET, MN2. A source of MP1 is connected with the virtual voltage supply VDDV, drains of MP1 and MN2 are connected together and form an output of the second inverter, gates of MP1 and MN2 are connected together and form an input of the second inverter, and a source of MN2 is connected with VSS, or an alternative voltage return of the circuit.

An input of the first inverter 1006 is configured to receive an input word line signal, WL_IN, an output of the first inverter is connected with the input of the second inverter, and the output of the second inverter is configured to generate an output word line signal, WL_OUT, which, when used in conjunction with a memory circuit (e.g., memory circuit 100 shown in FIG. 1), is operative to select a given word line (e.g., one of word lines WL_0 through WL_N shown in FIG. 1). While the output signal generated by the first inverter 1006 is constrained between VSS and VDD, the output word line signal WL_OUT generated by the second inverter switches between VDDV and VSS, where VDDV is the boosted voltage supply which is pulled above VDD during at least a portion of the duration of the CKLBSWC pulse. Thus, using the voltage boosting circuit 1000, the word line signal can go above VDD, thereby allowing a memory circuit using the voltage boosting circuit according to embodiments of the invention to be operated at a lower minimum supply voltage Vmin.

Figure 11:
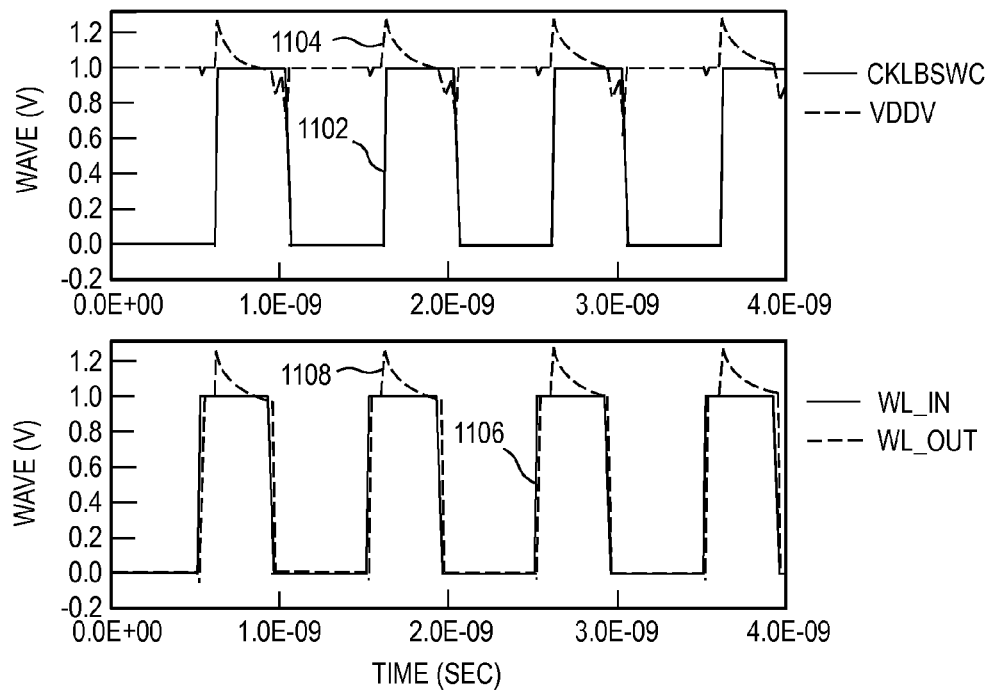
FIGS. 11 and 12 depict exemplary waveforms of certain signals in the word line driver circuit shown in FIG. 10 employing a FinFET device as the voltage-boosting element under various illustrative circuit parameters, according to embodiments of the invention.
Figure 12:
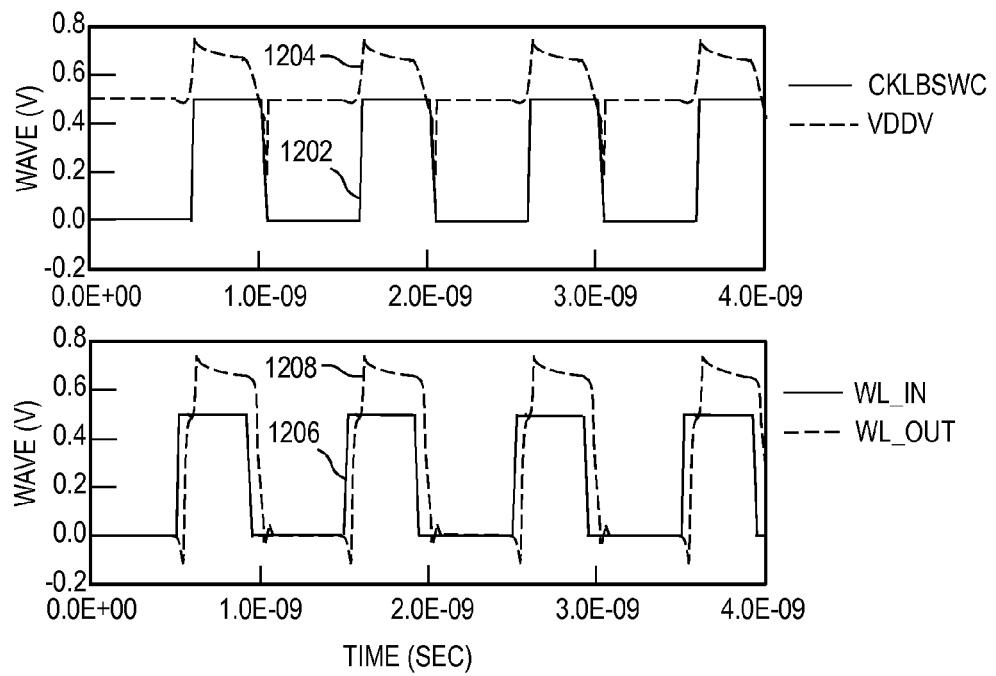

FIGS. 11 and 12 depict exemplary waveforms of certain signals in the word line driver circuit 1000 shown in FIG. 10 employing a FinFET device as the voltage-boosting element under various illustrative circuit parameters, according to embodiments of the invention. Specifically, in FIG. 11, a first waveform 1102 is indicative of the signal CKLBSWC, a second waveform 1104 is indicative of the virtual supply VDDV which is generated by the voltage boosting circuit, a third waveform 1106 is indicative of the input word line signal WL_IN, and a fourth waveform 1108 is indicative of the output word line signal WL_OUT. The waveforms 1102, 1104, 1106, 1108 are obtained using a fixed VDD supply voltage of 1.0 volt, a pulse width of the signal CKLBSWC of about 400 picoseconds (ps), and a slew rate of signal CKLBSWC of about 25 ps. As apparent from FIG. 11, whenever the signal CKLBSWC transitions from low (e.g., 0 volts) to high (e.g., 1.0 volt), the capacitive coupling effect of the FinFET device pulls the virtual supply VDDV above VDD, to a maximum of about 1.3 volts, for a substantial portion of the pulse duration (e.g., about 250 ps).

This boosted supply voltage VDDV differential (i.e., difference between VDD and VDDV) is transferred to the output word line signal WL_OUT, as evident by waveform 1108, which also exhibits a maximum magnitude of about 1.3 volts, since the output inverter in the word line driver circuit 1000 is powered from VDDV. As previously stated, a sharper slew rate associated with the signal CKLBSWC will generate a larger boosted voltage amplitude, and vice versa. Waveform 1106, which depicts the input word line signal WL_IN, does not exhibit a boosted amplitude, since this signal is not generated by the voltage boosting circuit 1000. Signal WL_IN, in this illustration, is essentially the same as the signal CKLBSWC, only shifted slightly in phase relative to CKLBSWC. The input word line signal WL_IN may be generated, for example, by an address decoder or alternative decoding circuitry (not explicitly shown) in the memory circuit in which the voltage boosting circuit 1000 of FIG. 10 is utilized.

As previously stated, the voltage boosting circuit according to aspects of the invention provides a more stable and sustained boosting voltage when the fixed voltage supply VDD is lowered, for example, to 0.5 volt. With reference now to FIG. 12, a first waveform 1202 is indicative of the signal CKLBSWC, a second waveform 1204 is indicative of the virtual voltage supply VDDV which is generated by the voltage boosting circuit, a third waveform 1206 is indicative of the input word line signal WL_IN, and a fourth waveform 1208 is indicative of the output word line signal WL_OUT. The waveforms 1202, 1204, 1206 and 1208 are obtained using a fixed VDD supply voltage of 0.5 volt, a pulse width of the signal CKLBSWC of about 400 picoseconds (ps), and a slew rate of signal CKLBSWC of about 25 ps. As apparent from FIG. 12, whenever the signal CKLBSWC transitions from low (e.g., 0 volts) to high (e.g., 0.5 volt), the capacitive coupling effect of the FinFET device pulls the virtual supply VDDV above VDD, to a maximum of about 0.75 volts. However, for this low supply voltage scenario, the virtual supply VDDV remains above VDD for most of the duration of the CKLBSWC pulse. For example, the VDDV supply voltage, even after about 350 ps, remains at about 0.65 volt. This boosted supply voltage VDDV differential (i.e., difference between VDD and VDDV) is transferred to the output word line signal WL_OUT, as evident by waveform 1208, which also exhibits a maximum magnitude of about 0.75 volts throughout the duration of the word line input signal WL_IN pulse.

An important benefit achieved using the voltage boosting techniques according to embodiments of the invention is that the boosted voltage is dynamically generated when needed (i.e., when a control signal transitions from low to high), thereby reducing power consumption. In this manner, the minimum supply voltage Vmin at which a circuit (e.g., memory or logic circuitry) reliably operates can be reduced. Furthermore, a memory circuit utilizing voltage boosting techniques according to embodiments of the invention can be combined with logic circuitry utilizing the novel voltage boosting techniques to achieve even greater performance benefits.

Figure 13:
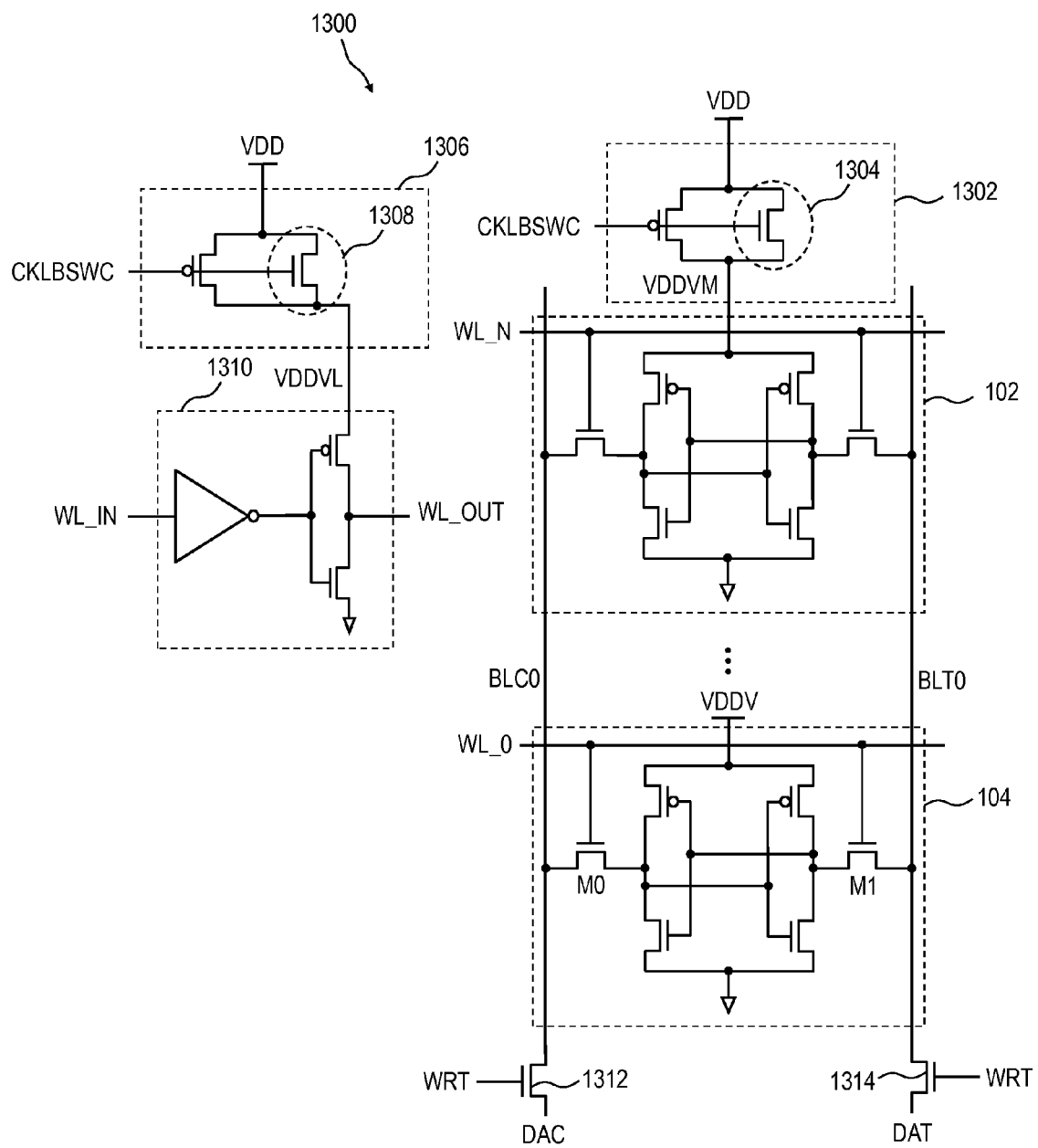
FIG. 13 is a schematic diagram depicting at least a portion of an exemplary memory circuit which incorporates FinFET-based supply voltage boosting for 6T memory cells and for logic circuitry (e.g., word line driver) in the memory circuit, according to an embodiment of the invention.

By way of example only and without limitation, FIG. 13 is a schematic diagram depicting at least a portion of an exemplary memory circuit 1300 which incorporates FinFET-based supply voltage boosting for memory cells and for logic circuitry (e.g., word line driver) in the memory circuit, according to an embodiment of the invention. The memory circuit 1300 includes a first voltage boosting circuit 1302 comprising an n-channel FinFET transistor 1304, functioning as the voltage-boosting element, connected in parallel with a PFET device in a manner consistent with the voltage boosting circuit 106 shown in FIG. 1. More particularly, a source of the PFET device and a drain of FinFET 1304 are adapted for connection with a voltage supply of the circuit, which in this embodiment is VDD, gates of the PFET and FinFET are connected together and adapted to receive a control signal CKLBSWC, and a drain of the PFET and a source of the FinFET are connected together and form an output of the voltage boosting circuit 1302 for generating a virtual (boosted) supply voltage VDDVM. Although an n-channel FinFET 1304 is shown, it is to be understood that a p-channel FinFET, or an alternative device having capacitive coupling characteristics similar to a FinFET device (e.g., silicon nanowire transistor), may also be used, with or without modification to the memory circuit 1300 and/or control signals (e.g., signal CKLBSWC) supplied thereto, as will become apparent to those skilled in the art given the teachings herein.

The memory circuit 1300 further includes a plurality of 6T SRAM cells, 102 and 104, and a plurality of corresponding bit lines, BLC0 and BLT0, and word lines, WL_0 through WL_N, coupled with the memory cells 102, 104 for selectively accessing the cells. Each of the memory cells 102, 104 in this embodiment may be implemented as previously described in conjunction with FIG. 1, although embodiments of the invention are not limited to any specific memory cell configuration or organization in the memory circuit 1300. Voltage boosting circuit 1302 is adapted for connection with a voltage supply of the memory circuit 1300, which in this embodiment is VDD, and is operative to generate the virtual boosted voltage supply VDDVM used for powering at least a subset of the memory cells 102, 104.

The memory circuit 1300 includes a second voltage boosting circuit 1306 comprising an n-channel FinFET transistor 1308, functioning as the voltage-boosting element, connected in parallel with a PFET device in a manner consistent with the voltage boosting circuit 106 shown in FIG. 1. Again, as for the voltage boosting circuit 1302, although an n-channel FinFET 1308 is utilized in voltage boosting circuit 1306, the invention is not limited to n-channel FinFET as the voltage boosting element (e.g., a p-channel FinFET or silicon nanowire transistor can alternatively be used). The voltage boosting circuit 1306 is adapted for connection with VDD and is operative to generate a virtual boosted voltage supply, VDDVL, used for powering logic circuitry in the memory circuit 1300, such as, for example, word line driver circuit 1310. The word line driver circuit 1310, which may be formed in a manner consistent with the exemplary output driver 1004 shown in FIG. 10, is operative to generate a boosted output word line signal, WL_OUT, as a function of an input word line signal, WL_IN, supplied to the memory circuit 1300. Although depicted in this embodiment as including separate voltage boosting circuits 1302 and 1306 for powering memory cells and logic circuitry, respectively, it is to be appreciated that the memory circuit 1300 may comprise a single voltage boosting circuit configured to power memory cells and logic circuitry included in the memory circuit.

Access transistors are included in the memory circuit 1300 for selectively supplying data to a given memory cell(s) during a write operation. Specifically, a first NFET access device 1312 is coupled with complement bit line BCL0 for selectively supplying data conveyed by a first data connection, DAC, to corresponding memory cells as a function of a write signal, WRT, supplied to the memory circuit 1300. Likewise, a second NFET access device 1314 is coupled with true bit line BCT0 for selectively supplying data conveyed by a second data connection, DAT, to corresponding memory cells as a function of the write signal WRT.

Figure 14:
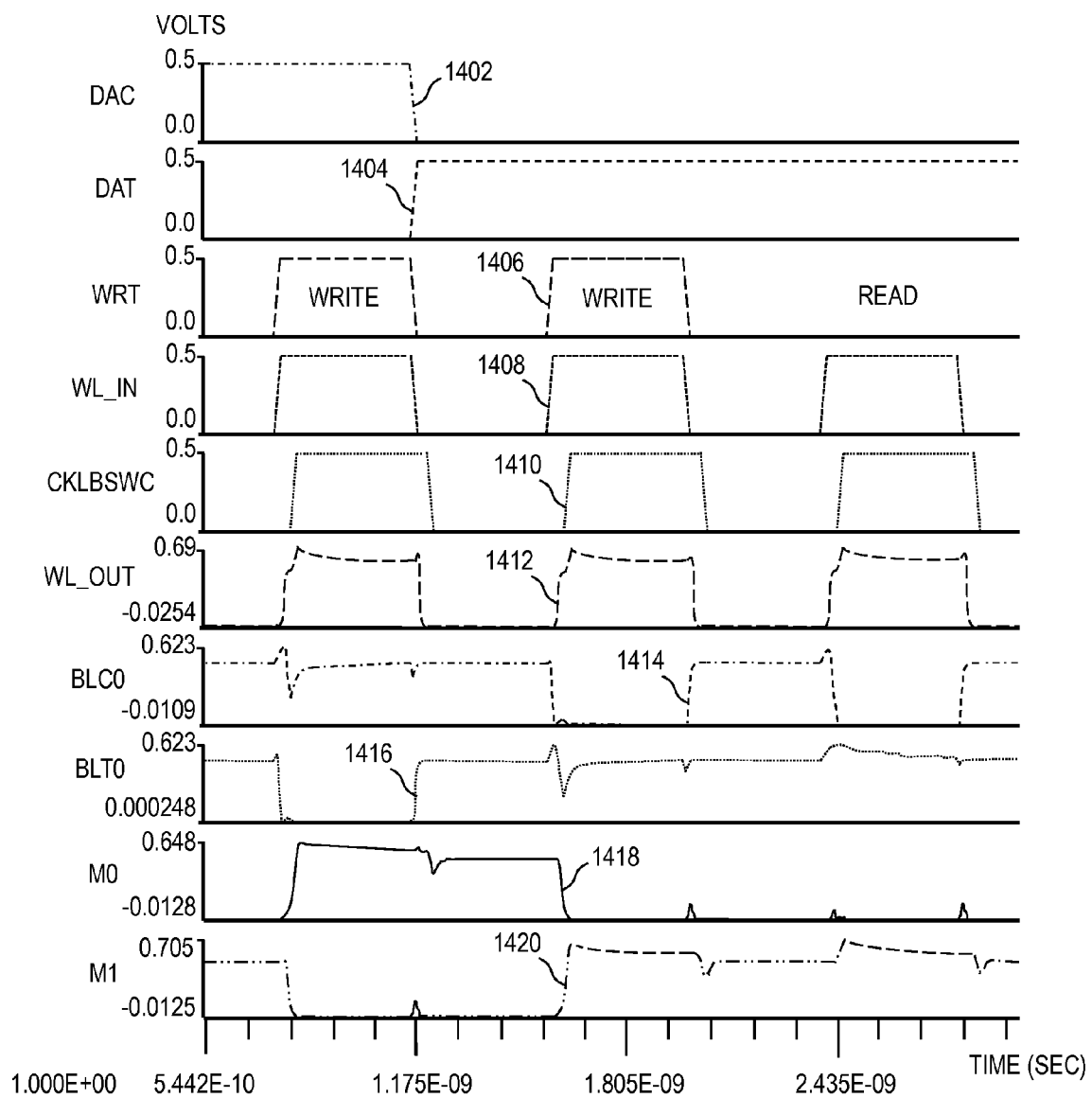
FIG. 14 depicts exemplary waveforms representing various signals associated with the illustrative memory circuit shown in FIG. 13, according to an embodiment of the invention.

By way of example only and without limitation, FIG. 14 depicts exemplary waveforms representing various signals associated with the illustrative memory circuit 1300 shown in FIG. 13, according to an embodiment of the invention. As apparent from FIG. 14, the signals DAC, DAT, WRT, WL_IN and CKLBSWC supplied to the memory circuit 1300 are all referenced with respect to VDD, and therefore switch between 0 and 0.5 volt, in this illustrative embodiment. The output word line signal WL_OUT, which is used to select a given one of the word lines (e.g., WL_0 through WL_N, where N is an integer greater than one) in the memory circuit 1300, switches to a level substantially above VDD (e.g., 0.69 volt) and remains above VDD for the duration of the write or read cycle.

As apparent from FIG. 14, waveforms of the internal complementary nodes, TRU and CMP, of a given memory cell show that voltage boosting has indeed taken place, since these internal nodes reach essentially the same value as that of the boosted voltage level; about 0.65 volt, for a supply voltage of 0.5 volt. The first two clock cycles depict a write operation and the bit lines toggled appropriately. Specifically, in the first cycle, a logic "0" is written to the memory cell through bit line BLT0, while in the second cycle, opposite data (i.e., a logic "1") is written to the cell through bit line BLT0. A third memory cycle depicts a read operation, wherein bit line BLT0 shows reading of a logic "1" from the memory cell, and BLC0 shows reading "0," which was written to the cell in the prior cycle.

Figure 15:
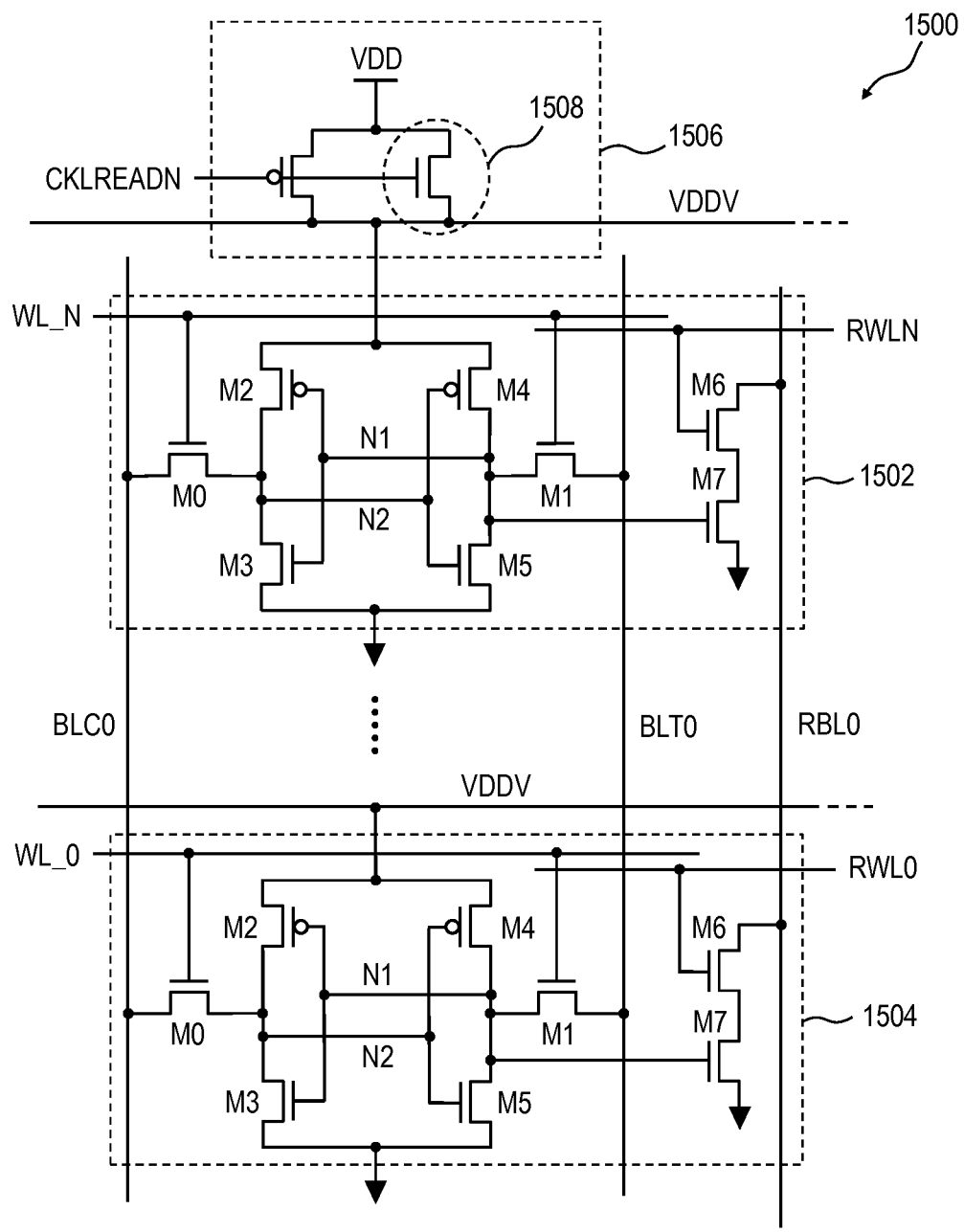
FIG. 15 is a schematic diagram depicting at least a portion of an exemplary memory circuit which incorporates FinFET-based supply voltage boosting for 8T memory cells in the memory circuit, according to another embodiment of the invention.

As previously stated, the FinFET voltage boosting techniques of the present invention can be similarly applied to a memory circuit utilizing 8T SRAM memory cells. By way of example only and without limitation, FIG. 15 is a schematic diagram depicting at least a portion of an exemplary memory circuit 1500 which incorporates FinFET-based supply voltage boosting for 8T memory cells, 1502 and 1504, in the memory circuit, according to an embodiment of the invention. Like the illustrative memory circuit 1300 shown in FIG. 13, memory circuit 1500 includes a supply voltage boosting circuit 1506 comprising an NMOS FinFET boosting device 1508 coupled between VDD and the virtual voltage supply VDDV. The FinFET device 1508 is adapted to receive, at its gate, a clock signal, CKLREADN, which controls operation of the voltage boosting circuit 1506 in a manner consistent with clock signal CKLBSWC used to control operation of boosting circuit 1302.

Each of the 8T memory cells 1502 and 1504 is preferably similar to the 6T memory cells 102 and 104 shown in FIGS. 1 and 13, with the exception of two added NMOS transistors M6 and M7, as well as corresponding read word lines, RWL0 and RWLN, and read bit line RBL0. A drain of transistor M6 is connected with a corresponding read bit line, RBL0 in this illustration, a gate of M6 is connected with a corresponding read word line, RWL0 in the case of memory cell 1504 and RWLN in the case of memory cell 1502, a source of M6 is connected with a drain of transistor M7, a source of M7 is connected with VSS or ground, and a gate of M7 is connected with an internal storage node N1 (true) in the corresponding memory cell.

When the read bit line corresponding to a selected memory cell is driven to a logic high level, such as during a read operation, transistor M6 in a corresponding memory cell will turn on. Read bit line RBL0 is preferably precharged to a logic high voltage level during a precharge mode of operation (e.g., when no read or write operation is occurring). Thus, when the internal storage node N1 is a logic high level, transistor M7 turns on and, when transistor M6 is active, the read bit line RBL0 will be pulled to VSS through M6 and M7. The read bit line can be sensed (e.g., by a sense amplifier) to determine the logical state of the memory cell in a conventional fashion.

It is to be understood that, although not explicitly shown, the memory circuit 1500 utilizing FinFET-based voltage boosting techniques according to embodiments of the invention can be combined with logic circuitry utilizing the novel voltage boosting techniques to achieve even greater performance benefits, in a manner consistent with the illustrative memory circuit 1300 shown in FIG. 13. Specifically, a word line driver circuit utilizing dynamic voltage boosting, which may be formed in a manner consistent with the exemplary word line driver circuit 1310 shown in FIG. 13, can be employed for generating a boosted output word line signal as a function of an input word line signal supplied to the memory circuit 1500. The read word line signal supplied to one or more of the read word lines RWL0 through RWLN can be boosted using a FinFET-based voltage boosting scheme consistent with the boosted word line driver used to generate a boosted voltage for word lines WL_0 through WL_N (i.e., write word lines), as shown in FIG. 13. In FIG. 13, the output of the boosted word line driver WL_OUT is same as WL_n (where n can be 0 to N), where these are boosted signals.

At least a portion of the embodiments of the invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

An integrated circuit in accordance with embodiments of the invention can be employed in essentially any application and/or electronic system in which a memory, either discrete or embedded, and/or logic circuitry are used. Suitable applications and systems for implementing techniques according to embodiments of the invention may include, but are not limited to, portable electronic devices, personal computers, data storage systems, servers, networking systems, etc. Systems incorporating such integrated circuits are considered part of embodiments of the invention. Given the teachings of the invention provided herein, one of ordinary skill in the art will be able to contemplate other implementations and applications of the techniques of the invention.

The embodiments of the invention described herein are intended to provide a general understanding of the various embodiments, and are not intended to serve as a complete description of all the elements and features of apparatus and systems that might make use of the structures described herein. Other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The abstract is provided to comply with 37 C.F.R. §1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other embodiments of the invention. Although embodiments of the invention have been described herein with reference to the accompanying drawings, it is to be understood that embodiments of the invention are not limited to the described embodiments, and that various other embodiments within the scope of the following claims will be apparent to those skilled in the art given the teachings herein.

What is claimed is:

1. A method for generating an output voltage supplied to a circuit, the output voltage having a magnitude that is greater than a voltage generated by a voltage supply of the circuit, the method comprising:
    providing a first transistor, the first transistor being a planar transistor;
    connecting a first source/drain of the first transistor with the voltage supply of the circuit;
    providing a second transistor having a gate formed in at least two planes;
    connecting a first source/drain of the second transistor with the voltage supply;
    supplying a control signal to a gate of each of the first and second transistors;
    connecting a second source/drain of the second transistor with a second source/drain of the first transistor to form an output for generating a boosted supply voltage as a function of the control signal.

2. The method of claim 1, further comprising connecting the output with at least one of a plurality of memory cells and logic circuitry in a memory circuit for reducing a minimum operating voltage of the memory circuit.

3. The method of claim 1, further comprising configuring a level of the voltage supply of the circuit such that a period of time during which the boosted supply voltage exceeds the level of the voltage supply of the circuit is substantially equal to a period of time between subsequent changes of state of the control signal.

4. The method of claim 1, wherein the second transistor comprises at least one of a fin-shaped field-effect transistor (FinFET), a nanowire transistor, and a T-shaped field-effect transistor (T-FET).

5. The method of claim 1, further comprising connecting the boosted supply voltage with at least one of a plurality of memory cells and logic circuitry in a memory circuit for reducing a minimum operating voltage of the memory circuit.

6. The method of claim 1, wherein when the control signal transitions from a first logic level, at which the second transistor is inactive, to a second logic level, at which the second transistor is active, capacitive coupling in the second transistor is operative to pull the boosted supply voltage up to a level that exceeds a level of the voltage supply of the voltage boosting circuit for a period of time equal to at least a portion of an interval during which the control signal is at the second logic level.

7. The method of claim 6, further comprising configuring the level of the voltage supply of the voltage boosting circuit such that the period of time during which the boosted supply voltage exceeds the level of the voltage supply of the voltage boosting circuit is substantially equal to a period of time between subsequent changes of state of the control signal supplied to the voltage boosting circuit.

8. The method of claim 1, further comprising configuring the voltage boosting circuit such that an amplitude of the boosted supply voltage is a function of a slew rate of the control signal supplied to the voltage boosting circuit.

9. The method of claim 1, further comprising connecting the output of the voltage boosting circuit with a voltage supply node of at least one word line driver circuit, the at least one word line driver circuit generating a boosted word line signal as a function of the control signal supplied to the voltage boosting circuit.

* * * * *